(12) United States Patent
Torikawa (10) Patent No.: US 10,971,330 B2
(45) Date of Patent: Apr. 6, 2021

(54) AUTOMATIC PROCESSING DEVICE

(71) Applicant: HITACHI HIGH-TECH SCIENCE CORPORATION, Tokyo (JP)

(72) Inventor: Shota Torikawa, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/496,275

(22) PCT Filed: Mar. 27, 2018

(86) PCT No.: PCT/JP2018/012608
§ 371 (c)(1),
(2) Date: Sep. 20, 2019

(87) PCT Pub. No.: WO2018/181408
PCT Pub. Date: Oct. 4, 2018

(65) Prior Publication Data
US 2020/0035453 A1 Jan. 30, 2020

(30) Foreign Application Priority Data
Mar. 27, 2017 (JP) .............................. JP2017-060902

(51) Int. Cl.
*H01J 37/305* (2006.01)
*H01J 37/20* (2006.01)
(Continued)

(52) U.S. Cl.
CPC .......... *H01J 37/3056* (2013.01); *H01J 37/20* (2013.01); *H01J 37/28* (2013.01); *H01J 37/317* (2013.01);
(Continued)

(58) Field of Classification Search
CPC ............. H01J 37/28; H01J 2237/31745; H01J 2237/31749; H01J 37/3005; H01J 37/20;
(Continued)

(56) References Cited

U.S. PATENT DOCUMENTS

| 9,336,987 B2* | 5/2016 | Torikawa ............ H01J 37/3045 |
| 2002/0066863 A1* | 6/2002 | Chao .................... H01J 37/304 250/397 |

(Continued)

FOREIGN PATENT DOCUMENTS

| JP | 2010-230672 A | 10/2010 |
| JP | 2013-170941 A | 9/2013 |

(Continued)

OTHER PUBLICATIONS

International Search Report and Written Opinion, with English translation, from International Application No. PCT/JP2018/012608, dated May 22, 2018, 8 pages.

*Primary Examiner* — David A Vanore
(74) *Attorney, Agent, or Firm* — Brinks Gilson & Lione (57) ABSTRACT

This automatic processing device for fabricating a sample piece from a sample by irradiating the sample with a charged particle beam is provided with: a structural information acquiring unit which acquires structural information indicating the structure of the sample before processing; a processing termination position acquiring unit which acquires termination position specifying information specifying a processing termination position corresponding to the structure of the sample; an image acquiring unit which acquires a processed surface image in which a processed surface appearing at the position at which the sample has been irradiated by the charged particle beam is captured; and a determining unit which determines whether the position of the processing by the charged particle beam has reached the termination position, on the basis of a comparison between (Continued)

the structural information acquired by the structural information acquiring unit and the processed surface image acquired by the image acquiring unit.

6 Claims, 7 Drawing Sheets

(51) Int. Cl.
    *H01J 37/28*     (2006.01)
    *H01J 37/317*     (2006.01)

(52) U.S. Cl.
    CPC ............ *H01J 2237/31745* (2013.01); *H01J 2237/31749* (2013.01)

(58) Field of Classification Search
    CPC ......... H01J 2237/3174; H01J 37/222; H01J 2237/2817; H01J 37/08; H01J 2237/08; H01J 2237/20285; H01J 2237/221; H01J 2237/244; H01J 2237/24578; H01J 2237/2814; H01J 2237/31713; H01J 2237/3175; H01J 2237/31798; G01N 23/2251; G01N 1/44
    USPC .......... 250/310, 307, 396 R, 423 R, 442.11, 250/492.1, 492.21
    See application file for complete search history.

(56) References Cited

U.S. PATENT DOCUMENTS

| | | | |
|---|---|---|---|
| 2005/0116182 A1* | 6/2005 | Tanaka | H01J 37/28 250/492.1 |
| 2006/0060781 A1* | 3/2006 | Watanabe | B82Y 10/00 250/310 |
| 2008/0073582 A1* | 3/2008 | Shichi | H01J 37/3045 250/492.21 |
| 2009/0206254 A1* | 8/2009 | Takahashi | H01J 37/244 250/307 |
| 2009/0230299 A1* | 9/2009 | Shichi | H01J 37/08 250/282 |
| 2010/0243889 A1 | 9/2010 | Faber et al. | |
| 2013/0146763 A1* | 6/2013 | Kawada | G01B 15/00 250/306 |
| 2013/0186747 A1* | 7/2013 | Schmidt | H01J 37/3005 204/192.33 |
| 2013/0214458 A1 | 8/2013 | Suzuki | |
| 2013/0248710 A1 | 9/2013 | Sato et al. | |
| 2014/0061159 A1* | 3/2014 | Asahata | H01J 37/28 216/85 |
| 2014/0284307 A1* | 9/2014 | Asahata | H01J 37/3056 216/60 |
| 2014/0291512 A1* | 10/2014 | Nakatani | H01J 37/3056 250/307 |
| 2015/0014529 A1* | 1/2015 | Nanri | H01J 37/3178 250/310 |
| 2016/0064187 A1* | 3/2016 | Tomimatsu | H01J 37/20 250/453.11 |
| 2016/0093467 A1* | 3/2016 | Torikawa | H01J 37/3045 250/310 |
| 2018/0054575 A1* | 2/2018 | Pawlowicz | H01J 37/28 |
| 2018/0204705 A1* | 7/2018 | Tomimatsu | G01N 1/286 |
| 2018/0282870 A1* | 10/2018 | Torikawa | C23C 16/30 |
| 2018/0350558 A1* | 12/2018 | Franco | G01N 1/32 |
| 2019/0157037 A1* | 5/2019 | Tomimatsu | G02B 27/0955 |
| 2019/0259574 A1* | 8/2019 | Yamamoto | H01J 37/3005 |

FOREIGN PATENT DOCUMENTS

| | | |
|---|---|---|
| JP | 2013-200987 A | 10/2013 |
| JP | 2014-022296 A | 2/2014 |

* cited by examiner

WORKING PROGRESS DIRECTION D

FIG. 5

PROGRESS DIRECTION　　PROGRESS DIRECTION
D1 OF FIRST WORKING　　D2 OF SECOND WORKING

AUTOMATIC PROCESSING DEVICE

RELATED APPLICATIONS

This application is a 371 application of PCT/JP2018/012608 having an international filing date of Mar. 27, 2018, which claims priority to JP2017-060902 filed Mar. 27, 2017, the entire content of which is incorporated herein by reference.

TECHNICAL FIELD

The present invention relates to an automatic working apparatus.

BACKGROUND ART

There have been known apparatuses that pick up a sample piece produced by irradiating a sample with a charged particle beam consisting of electrons or ions and then work the sample piece, into a shape that is suitable for various steps such as observation, analysis, measurement, etc. using a scanning electron microscope, a transmission electron microscope, or the like (refer to PTLs 1 and 2, for example).

For example, in case where a sample in which the same structural bodies such as memory devices are arranged so as to form repetitive structures is worked using a charged particle beam, a TEM analysis sample (TEM sample) may be produced while one certain structural body, for example, remains left. Where in this manner a sample is produced in the longitudinal direction of a long and narrow structural body or along the row of structural bodies arranged in a row, the scanning direction of a charged particle beam is corrected so that working can be performed in parallel with the structural body or the row. The same is true of not only production of a TEM sample but also all cases in which a cross section(s) is formed.

CITATION LIST

Patent Literature

PTL 1: JP-A-2013-170941
PTL 2: JP-A-2013-200987

SUMMARY OF INVENTION

Technical Problem

For example, in case where a TEM analysis sample (TEM sample) is produced while one certain structural body, for example, remains left, an operator of a charged particle beam apparatus performs manual working so as to leave only one desired structural body by observing cross sections formed by a charged particle beam with proper timing. However, with the recent progress in miniaturization and complexity of latest devices, the difficulty of production of a sample for analysis using a charged particle beam is being increased year by year. This results in a situation that technicians capable of performing such work are restricted. If an unskilled technician does such work, the work takes a very long time. Furthermore, it increases the risk that he or she fails to determine a correct working end position and an analysis target is thereby lost. For this reason, production of a sample using a charged particle beam needs to be simplified and saved in labor.

The present invention has been made in the above circumstances, and an object of the invention is therefore to provide an automatic working apparatus configured to determine whether the working position of a charged particle beam has reached an end position.

Solution to Problem

In order to solve the above problems and achieve the object, the present invention employs the following aspects.

(1) An automatic working apparatus according to one aspect of the present invention is an automatic working apparatus for producing a sample piece from a sample by irradiating the sample with a charged particle beam, the automatic working apparatus comprising: a structure information obtaining unit configured to obtain structure information indicating a structure of the sample before working; a working end position obtaining unit configured to obtain end position specifying information that specifies an end position of working corresponding to the structure of the sample; an image obtaining unit configured to obtain a working surface image, the working surface image being obtained by imaging a working surface that appears at a position where the sample is irradiated with the charged particle beam; and a determining unit configured to determine whether a working position of the charged particle beam has reached the end position on the basis of a comparison between the working surface image obtained by the image obtaining unit and the structure information obtained by the structure information obtaining unit.

(2) In the automatic working apparatus according to (1) described above, the structure information is an image obtained by imaging the sample before working, and the determining unit is configured to determine whether the working position of the charged particle beam has reached the end position on the basis of a comparison between the working surface image and the image obtained by imaging the sample before working.

(3) in the automatic working apparatus according to (2) described above, the sample has repetitive structures, the structure information is an image obtained by imaging the repetitive structures of the sample before working; wherein the working end position obtaining unit is configured to obtain information indicating the repetition number of repetitive structures as the end position specifying information, and the determining unit is configured to determine whether the working position of the charged particle beam has reached the end position on the basis of a result of comparison between the repetition number of repetitive structures found in working surface images and the repetition number of repetitive structures indicated by the image obtained by imaging the sample of the sample before working.

(4) In the automatic working apparatus according to (3) described above, the determining unit is configured to determine whether the working position of the charged particle beam has reached the end position on the basis of a comparison between the repetition number of repetitive structures remaining unworked that is indicated by working surface images and the repetition number of the repetitive structures indicated by the image obtained by imaging the repetitive structures of the sample before working.

(5) In the automatic working apparatus according to (3) described above, the determining unit is configured to determine whether the working position of the charged particle beam has reached the end position on the basis of a comparison between the number of changes to a repetitive structure that occur sequentially in working surface images as the working proceeds and the repetition number of repetitive structures indicated by the image obtained by imaging the sample before working.

(6) In the automatic working apparatus according to (1) described above, the structure information is design information of the sample before working, and the determining unit is configured to determine whether the working position of the charged particle beam has reached the end position on the basis of a comparison between the working surface image and the design information of the sample before working.

Advantageous Effects of Invention

The automatic working apparatus according to the invention can determine whether the working position of a charged particle beam has reached an end position.

DESCRIPTION OF EMBODIMENTS

An automatic working apparatus 1 according to an illustrative embodiment of the present invention will be hereinafter described with reference to the drawings.

Figure 1:
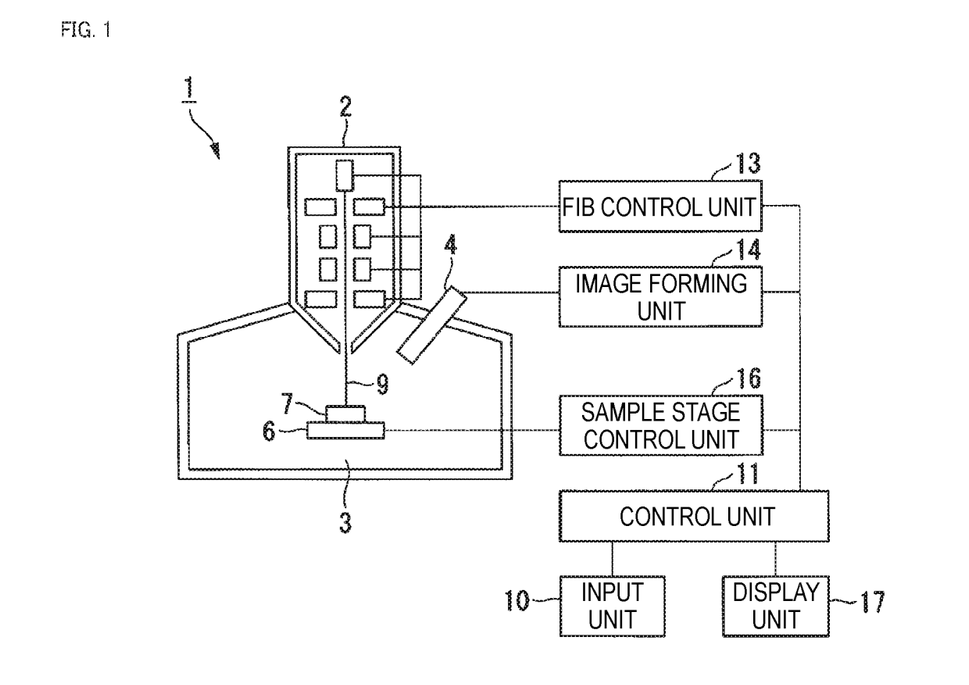
FIG. 1 shows the configuration of an automatic working apparatus according to an illustrative embodiment of the present invention.

FIG. 1 shows the configuration of the automatic working apparatus 1 according to the illustrative embodiment of the invention.

As shown in FIG. 1, the automatic working apparatus 1 according to the illustrative embodiment is equipped with an FIB column 2, a sample chamber 3, a secondary electron detector 4, and a sample stage 6.

The FIB column 2 irradiates a sample 7 housed in the sample chamber 3 with a focused ion beam (FIB). In the following description, the focused ion beam will also be referred to simply as an "ion beam 9."

The secondary electron detector 4, which is a charged particle detector, detects secondary electrons generated from the sample 7 in response to irradiation with the ion beam 9.

The sample 7 is mounted on the sample stage 6. The angle of incidence of the ion beam 9 on the sample 7 is changed by inclining the sample stage 6.

The automatic working apparatus 1 is also equipped with an input unit 10, a control unit 11, an FIB control unit 13, an image forming unit 14, a sample stage control unit 16, and a display unit 17.

The sample stage control unit 16 controls the inclination of the sample stage 6 by outputting a slant angle control signal to the sample stage 6.

The FIB control unit 13 causes the FIB column 2 to emit an ion beam 9 by outputting an irradiation control signal to the FIB column 2.

The image forming unit 14 generates data of a SIM image on the basis of a signal of the FIB control unit 13 for causing a scan with the ion beam 9 and a signal indicating secondary electrons detected by the secondary electron detector 4.

The display unit 17 displays a SIM image on the basis of the SIM image data generated by the image forming unit 14.

The input unit 10 detects a manipulation of an operator and supplies information indicating the detected manipulation to the control unit 11. When the operator performs a manipulation for starting working on the input unit 10, the input unit 10 sends a working start instruction to the control unit 11.

The control unit 11 executes an algorithm of automatic cross section working and observation.

Structure of Sample 7

Next, an example structure of the sample 7 used in the illustrative embodiment will be described with reference to FIG. 2.

Figure 2:
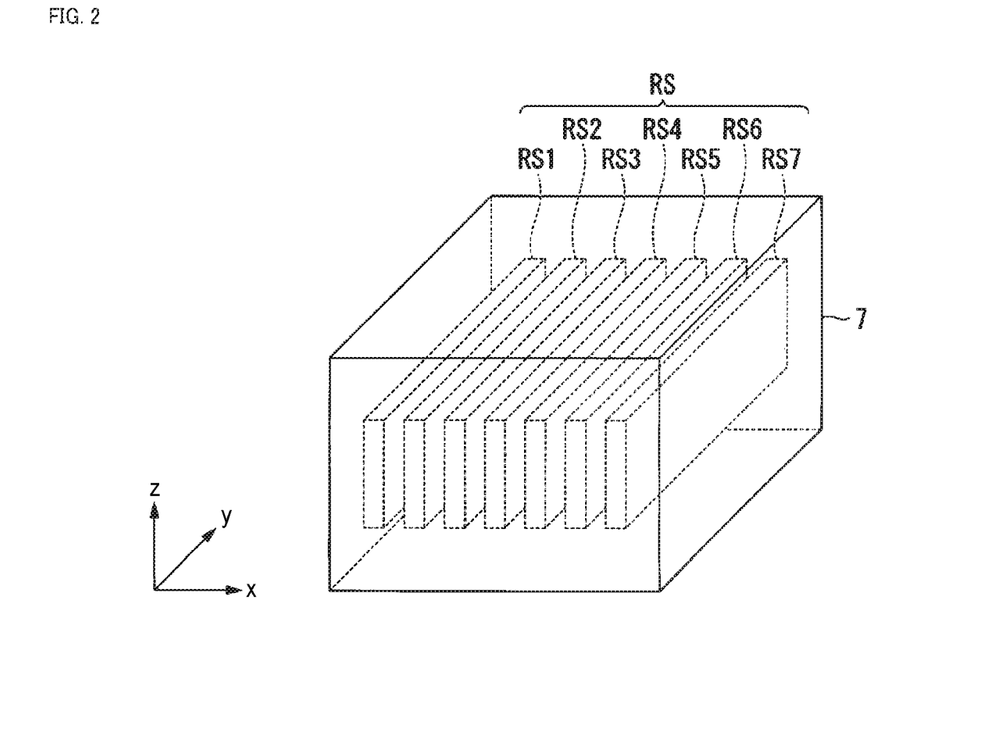
FIG. 2 shows an example structure of a sample used in the illustrative embodiment

FIG. 2 shows an example structure of the sample 7 used in the illustrative embodiment. In the following, a description will be made using an xyz orthogonal coordinate system if necessary. The x axis and the y axis of the xyz orthogonal coordinate system indicate the plane which the sample 7 is mounted with the sample stage 6. The z axis indicates the normal line to the plane which the sample 7 is mounted with the sample stage 6. In this example, the sample 7 has repetitive structures RS in which the same structure appears repetitively in the x-axis direction. In this specific example, the sample 7 has seven repetitive structures RS, that is, from a repetitive structure RS1 to a repetitive structure RS7.

In this illustrative embodiment, an example case will be described in which among the repetitive structures RS the repetitive structure RS4 is cut out of the sample 7 as an analysis target sample piece.

Functional Configuration of Control Unit 11

Figure 3:
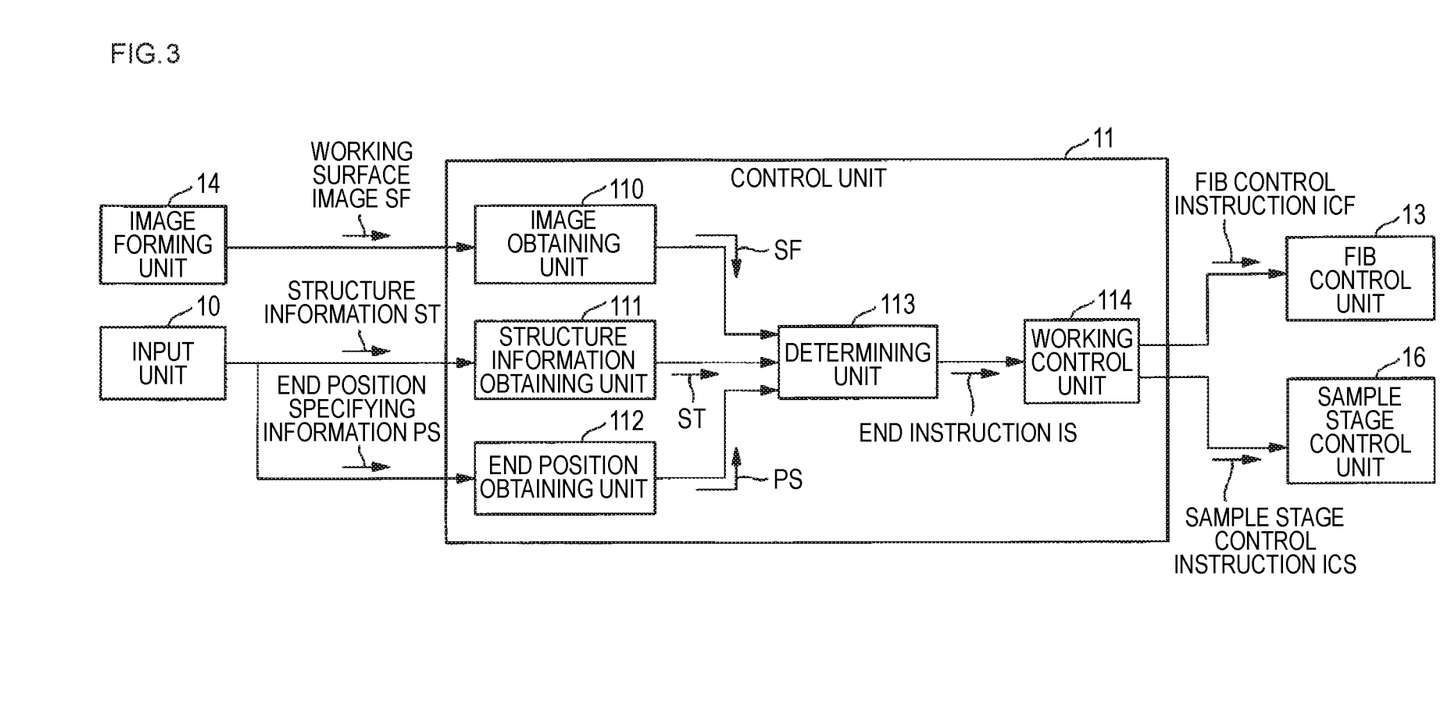
FIG. 3 shows an example of a functional configuration of a control unit employed in the illustrative embodiment.

FIG. 3 shows an example of a functional configuration of the control unit 11 employed in the illustrative embodiment. The control unit 11 is equipped with a CPU, for example, and is also equipped with, as its functional units, an image obtaining unit 110, a structure information obtaining unit 111, an end position obtaining unit 112, a determining unit 113, and a working control unit 114.

The image obtaining unit 110 obtains an image formed by the image forming unit 14. In this example, the image forming unit 14 generates a working surface image SF which is an image of a working surface that appears at a position, irradiated with the ion beam 9, of the sample 7. In this case, the image obtaining unit 110 obtains the working surface image SF.

The structure information obtaining unit 111 obtains structure information ST indicating a structure of the sample 7 before working. In this example, the structure information ST is an image of the sample 7 taken before working.

The end position obtaining unit 112 obtains end position specifying information PS. The end position specifying information PS is information that specifies a working end position PSTOP that corresponds to the structure of the sample 7. The working end position PSTOP is specified by an operator before a start of working. More specifically, the operator determines a portion to be made an analysis target sample piece among the repetitive structures RS of the sample 7. In this example, the operator decides on the repetitive structure RS4 of the sample 7 as an analysis target sample piece. The operator performs, on the input unit 10, a manipulation of deciding on the repetitive structure RS4 as an analysis target sample piece. Upon detecting this manipulation of the operator, the input unit 10 outputs, to the end position obtaining unit 112, end position specifying information PS that specifies, as a working end position, a position where the repetitive structure RS4 is to remain unworked when the sample 7 has been worked. The end position obtaining unit 112 obtains this end position specifying information PS.

The determining unit 113 determines whether the working position of the ion beam 9 has reached the working end position PSTOP. In this example, the determining unit 113 determines whether the working position of the ion beam 9 has reached the working end position PSTOP on the basis of a result of comparison between the working surface image SF obtained by the image obtaining unit 110 and the structure information ST obtained by the structure information obtaining unit 111.

The working control unit 114 controls the working on the sample 7 by outputting an FIB control instruction ICF to the FIB control unit 13 and outputting a sample stage control instruction ICS to the sample stage control unit 16. When the determining unit 113 outputs an end instruction IS indicating that the working position has reached the end position PSTOP, the working control unit 114 finishes the working on the sample 7.

Operation of Control Unit 11

Next, an example operation of the control unit 11 will be described with reference to FIGS. 4 to 7A-7C. In the illustrative embodiment, an example case will be described in which the automatic working apparatus 1 forms a repetitive structure RS4 as a sample piece from the sample 7 by irradiating the sample 7 shown in FIG. 2 with an ion beam 9.

Figure 4:
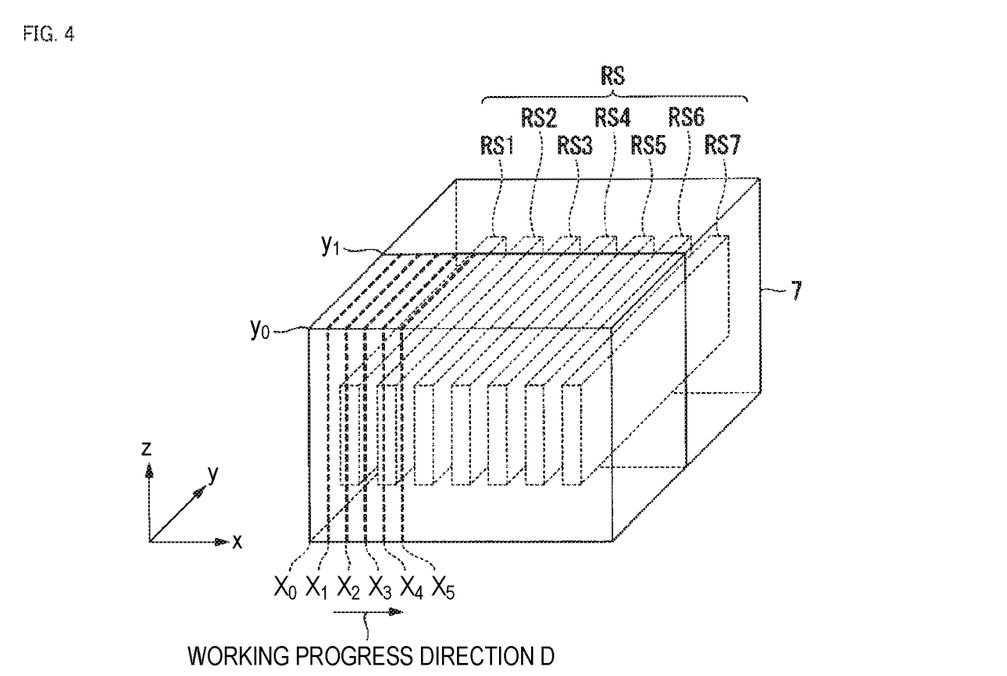
FIG. 4 shows an example appearance of the sample before a start of working in the illustrative embodiment

FIG. 4 shows an example appearance of the sample 7 before a start of working in the illustrative embodiment. As described above, the sample 7 has the repetitive structures RS which are arranged in the x-axis direction. In the example of the illustrative embodiment, the automatic working apparatus 1 cuts out the repetitive structure RS4 as an analysis target. More specifically, the automatic working apparatus 1 exposes the repetitive structure RS4 by performing slice working on the repetitive structures RS1 to RS3 and RS5 to RS7 using the ion beam 9.

The automatic working apparatus 1 performs a scan with the ion beam 9 by setting an irradiation range of position y0 to position y1 in the y-axis direction and moving the irradiation range in the x-axis direction. The automatic working apparatus 1 performs slice working on the repetitive structures RS1 to RS3 sequentially by moving the ion beam 9 from position x0 to position x5 in the x-axis direction, that is, in a working progress direction D. The automatic working apparatus 1 also performs slice working on the repetitive structures RS7 to RS5 sequentially. However, since its procedure is the same as when slice working is performed on the repetitive structures RS1 to RS3 and hence will not be described.

Figure 5:
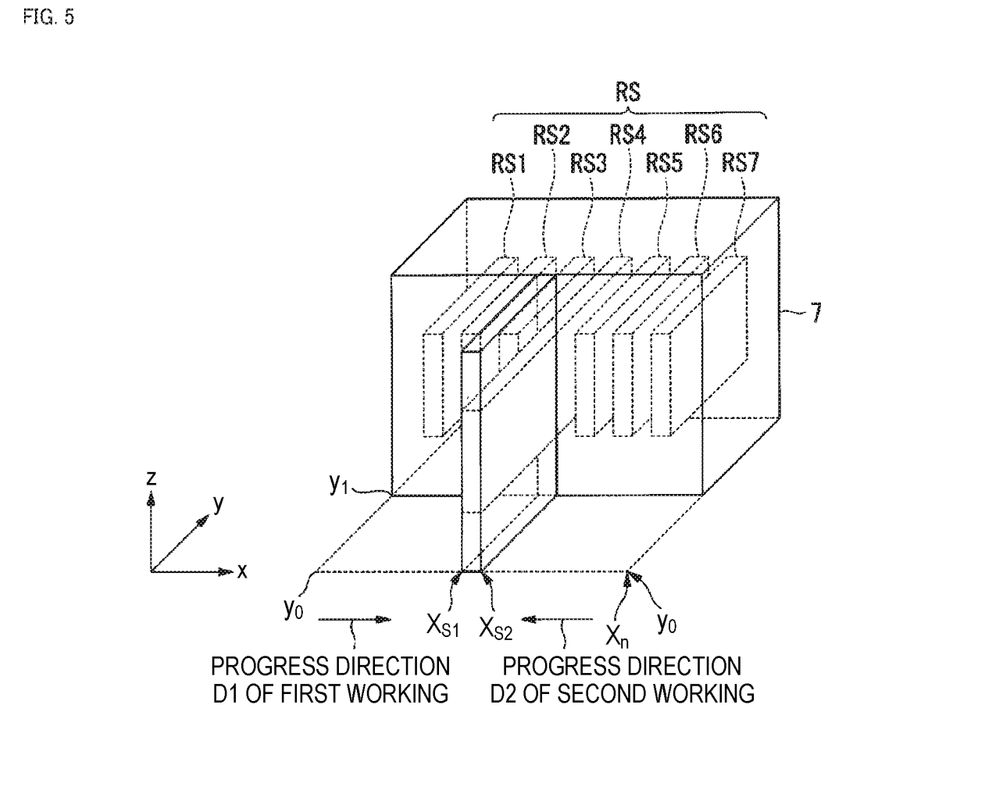
FIG. 5 shows an example appearance of the sample after completion of the working in the illustrative embodiment.

FIG. 5 shows an example appearance of the sample 7 after completion of the working in the illustrative embodiment. The automatic working apparatus 1 cuts out the repetitive structure RS4 by first working of performing slice working on the repetitive structures RS1 to RS3 and second working of performing slice working on the repetitive structures RS7 to RS5. More specifically, the automatic working apparatus 1 performs slice working by moving the irradiation position of the ion beam 9 in a progress direction D1 (i.e., +x direction) of the first working from position x0 and finishes the working when the irradiation position reaches position xs1 which is a position of the repetitive structure RS4. Furthermore, the automatic working apparatus 1 performs slice working by moving the irradiation position of the ion beam 9 in a progress direction D2 (i.e., −x direction) of the second working from position xn and finishes the working when the irradiation position reaches position xs2 which is another position of the repetitive structure RS4. A sample piece shown in FIG. 5 is formed as a result of execution of the first working and the second working.

Next, a procedure according to which the automatic working apparatus 1 works the sample 7 before working shown in FIG. 4 into the working-finished sample 7 shown in FIG. 5 will be described with reference to FIG. 6.

Figure 6:
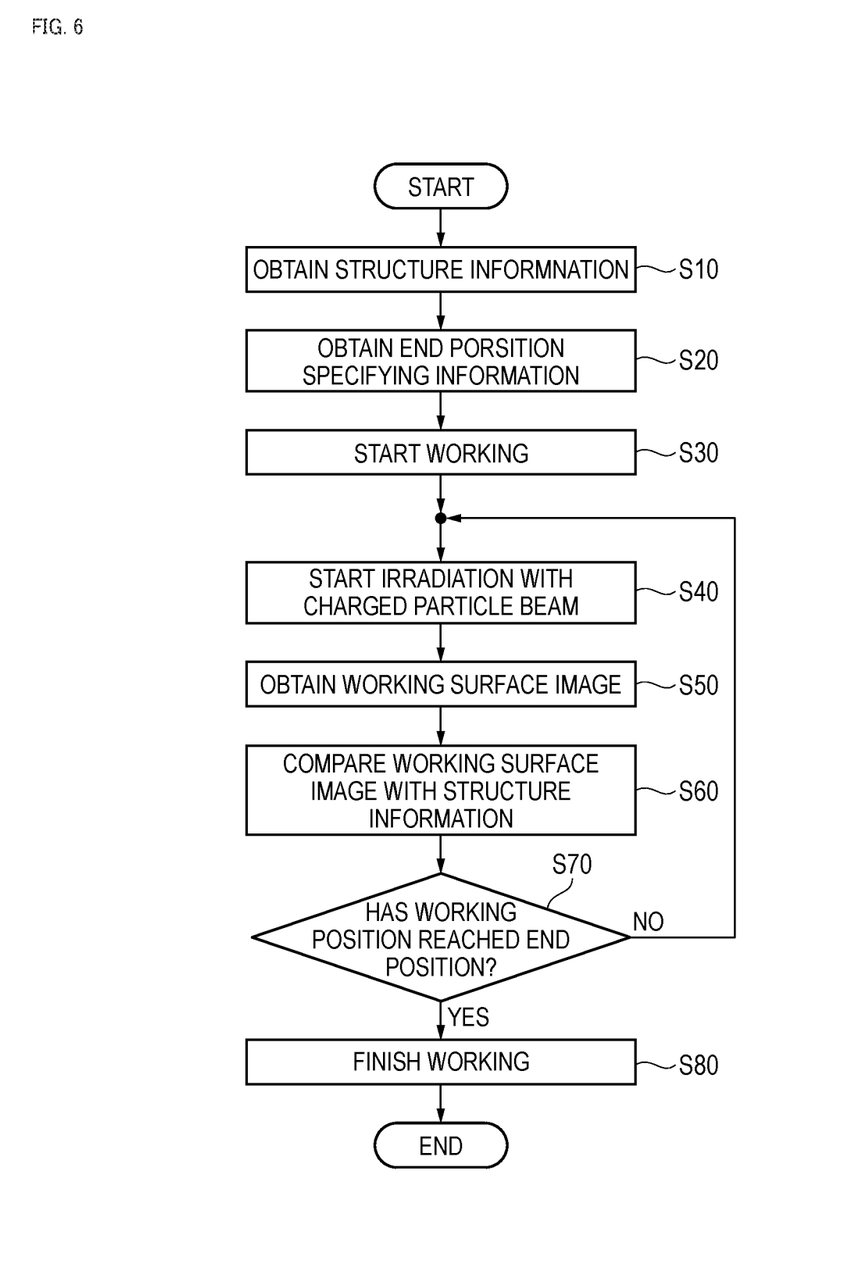
FIG. 6 shows an example operation of a control unit employed in the illustrative embodiment.

FIG. 6 shows an example operation of the control unit 11 employed in the illustrative embodiment, (Step S10) The structure information obtaining unit 111 obtains structure information ST. The structure information ST obtained by the structure information obtaining unit 111 is information indicating the structure of the sample 7 before working. This specific example will be described with an assumption that the structure information ST is the image of the sample 7 before working shown in FIG. 4. In this case, the structure information ST includes an image, appearing in the xz cross section of the sample 7, of the repetitive structures RS. That is, the structure information ST indicates the number of repetitive structures RS included in the sample 7.

(Step S20) The end position obtaining unit 112 obtains an end position specifying information PS.

There may occur a case that an operator of the automatic working apparatus 1 wants to specify a target to be cut out as a sample piece in the form of a number indicating a repetitive structure RS instead of its coordinates in the sample 7. For example, there may occur a case that the operator wants to specify that a fourth repetitive structure RS of the sample 7 as counted from position x0 (i.e., repetitive structure RS4) should be cut out as a sample piece. In this case, the operator performs a manipulation for specifying that the fourth repetitive structure RS should be cut out as a sample piece. The end position obtaining unit 112 receives this manipulation of the operator as an end position specifying information PS.

That is, the end position obtaining unit 112 obtains, as end position specifying information PS, information indicating a repetition number indicating a repetitive structure.

At this time, the determining unit 113 determines a working end position on the basis of the structure information ST obtained by the structure information obtaining unit 111 and the end position specifying information PS obtained by the end position obtaining unit 112. An example manner of judgment of a working end position by the determining unit 113 will be described with reference to FIGS. 7A-7C.

Figure 7A:
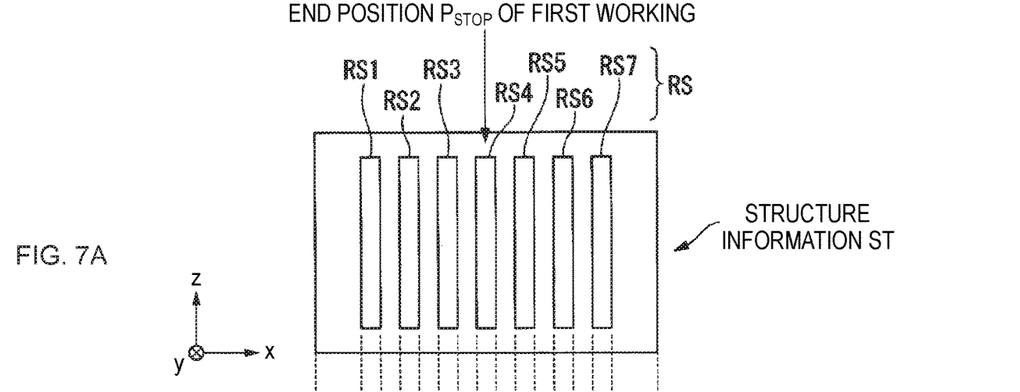
FIGS. 7A, 7B and 7C show an example manner of judgment of a working end position by a determining unit employed in the illustrative embodiment.
Figure 7B:
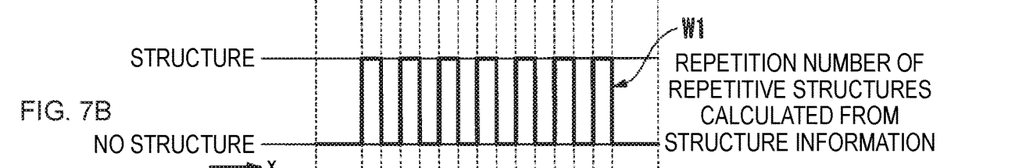
Figure 7C:
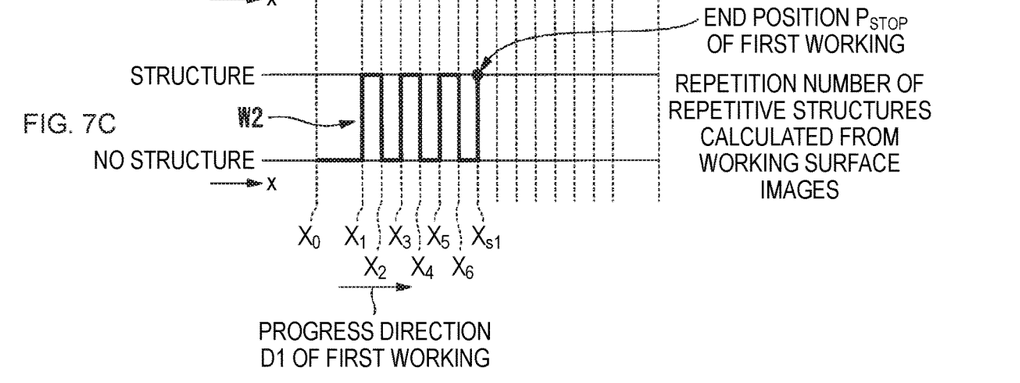

FIGS. 7A-7C show an example manner of judgment of a working end position by the determining unit 113 employed in the illustrative embodiment. As shown in FIG. 7A, the structure information ST obtained by the structure information obtaining unit 111 shows a state of an xz cross section of the sample 7. The determining unit 113 analyzes the state of an xz cross section of the sample 7 indicated by the structure information ST and discriminates between portions having a structure and structure-less portions of the sample 7 in a manner indicated by a waveform W1 in FIG. 7B. The waveform W1 indicates a cycle and the repetition number of each repetitive structure RS of the sample 7.

In the above specific example, the fourth repetitive structure RS (i.e., repetitive structure RS4), as counted from position x0, of the sample 7 is cut out as a sample piece. In this case, the determining unit 113 counts the number of mountains in the waveform W1 in the direction D1 (+x direction) of progress of the first working from position x0. As shown in FIG. 7C, the determining unit 113 determines that position xs1 where the count of the number of mountains in the waveform W1 becomes "4" is an end position PSTOP of the first working.

Returning to FIG. 6, the description of a procedure according to which the automatic working apparatus 1 works the sample 7 continues below.

(Step S30) The working control unit 114 starts working on the sample 7.

(Step S40) The working control unit 114 performs slice working on the sample 7 by outputting an FIB control instruction ICF to the FIB control unit 13 and outputting a sample stage control instruction to the sample stage control unit 16.

(Step S50) The image obtaining unit 110 obtains an image of a working surface (working surface image SF) of the sample 7 from the image forming unit 14.

In the specific example of the illustrative embodiment, the working surface image SF is an image of the sample 7 taken from the x direction. The working surface image SF shows a state of a yz cross section, that is, a working surface, of the sample 7. As slice working operations are performed sequentially in the x direction by the working control unit 114, there occur a case that a repetitive structure RS is found in a working surface and a case that a repetitive structure RS is not found in a working surface. Thus, the degree of progress of the working can be determined by obtaining working surface images SF sequentially in the time axis of working and counting the number of times a repetitive structure RS appears in a working surface.

(Step S60) The determining unit 113 determines whether the working surface position of the working using the ion beam 9, that is, the working position, has reached the above-mentioned end position PSTOP by comparing the working surface image SF obtained at step S50 with the working end position PSTOP.

More specifically, the determining unit 113 counts the number of times of a change from a state that a repetitive structure RS is not found in the working surface image SF obtained at step S50 to a state that a repetitive structure RS is found in a working surface (see FIG. 7C. The determining unit 113 compares this count with the number (in this example "4") of repetitive structures RS from the working start position x0 to the end position PSTOP.

That is, the determining unit 113 determines whether the working position of the ion beam 9 has reached the working end position PSTOP on the basis of a result of comparison between the number of changes to a repetitive structure occurring sequentially in working surface images SF as the working proceeds and the number of repetitive structures in the image obtained by imaging the sample 7 before working.

In even other words, the determining unit 113 determines whether the working position of the ion beam 9 has reached the working end position PSTOP on the basis of a result of comparison between the number of repetitive structures RS found in working surface images SF and the number of repetitive structures in the image obtained by imaging the sample 7 before working.

Although in this example the determining unit 113 counts the number of repetitive structure RS that have been subjected to slice working on the basis of working surface images SF, the invention is not limited to this case. The determining unit 113 may count the number of repetitive structures RS in the sample 7 that remain unworked on the basis of working surface images SF. That is, the determining unit 113 may determine whether the working position of the ion beam 9 has reached the working end position PSTOP on the basis of a result of comparison between the number of repetitive structures RS remaining unworked that is indicated by working surface images SF and the repetition number of repetitive structures in the image obtained by imaging the sample 7 before working.

If the comparison shows that the count does not coincide with the number of repetitive structures RS from position x0 to the end position PSTOP, the determining unit 113 determines that the working position has not reached the end position PSTOP yet (step S70: no), whereupon the process returns to step S40 to continue the working.

If the comparison shows that the count coincides with the number of repetitive structures RS from position x0 to the end position PSTOP, the determining unit 113 determines that the working position has reached the end position PSTOP (step S70: yes), whereupon the working is finished (step S80) and the execution of the series of steps is finished.

Summary of Illustrative Embodiment

As described above, the automatic working apparatus 1 according to the illustrative embodiment finishes, automatically, that is, with involvement of no human work, working that is performed in forming a sample piece from the sample 7 on the basis of structure information ST and end position specifying information PS. That is, the automatic working apparatus 1 according to the illustrative embodiment automatically determines whether the working position of a charged particle beam has reached an end position. Thus, the automatic working apparatus 1 enables production of a sample that is not influenced by the level of skill of an operator. Furthermore, the automatic working apparatus 1 enables unmanned operation and increase in work efficiency and apparatus operation rate.

Modifications

The example case where the structure information ST is an image obtained by imaging the sample 7 before working has been described. In this case, if repetitive structures RS do not appear in the surface of the sample 7 before working, it may be impossible to count the number of repetitive structures RS of the sample 7. In such a case, an image taken in a state that slice working has been performed on a part of the sample 7 before working in advance and the repetitive structures RS are thereby exposed may be used as structure information ST. In this case, for example, the repetitive structures RS are exposed by performing slice working with the xz plane shown in FIG. 2 as a working surface.

In slice working for exposing the repetitive structures RS, oblique working may be performed on a part of a surface to be shot by the image forming unit 14 (i.e., imaging cross section) or the imaging cross section and desired extended portions of the repetitive structures RS included in the depth direction of the imaging cross section so that the repetitive structures RS are exposed when viewed from the imaging direction.

In case where there are plural samples 7 having the same structure, a procedure may be employed that structure information ST is generated by imaging one sample 7 after performing slice working exposing repetitive structures RS on a sample 7 and is used in working other samples 7 to produce a sample piece. Generating structure information ST in this manner can dispense with performing unnecessary working on the samples 7 from which to produce a sample piece.

The structure information ST may be design information (e.g., three-dimensional CAD data) indicating an internal structure of the sample 7, instead of an image. In this case, the determining unit 113 determines whether the working position of an ion beam 9 has reached the end position PSTOP on the basis of a result of comparison between the working surface image SF and the design information of the sample 7. In case where the structure information ST is design information as in this modification, the determining unit 113 can determine at what position the sample 7 is being worked by comparing the working surface image SF with the design information even if the sample 7 does not have repetitive structures RS. Thus, in case where the structure information ST is design information, the automatic working apparatus 1 can determine whether the working position of an ion beam 9 has reached the end position PSTOP even if the sample 7 does not have repetitive structures RS.

A description will now be made of a specific example of the case that whether the working position has reached the end position PSTOP is determined on the basis of a result of comparison between the working surface image SF and design information of the sample 7.

Figure 8:
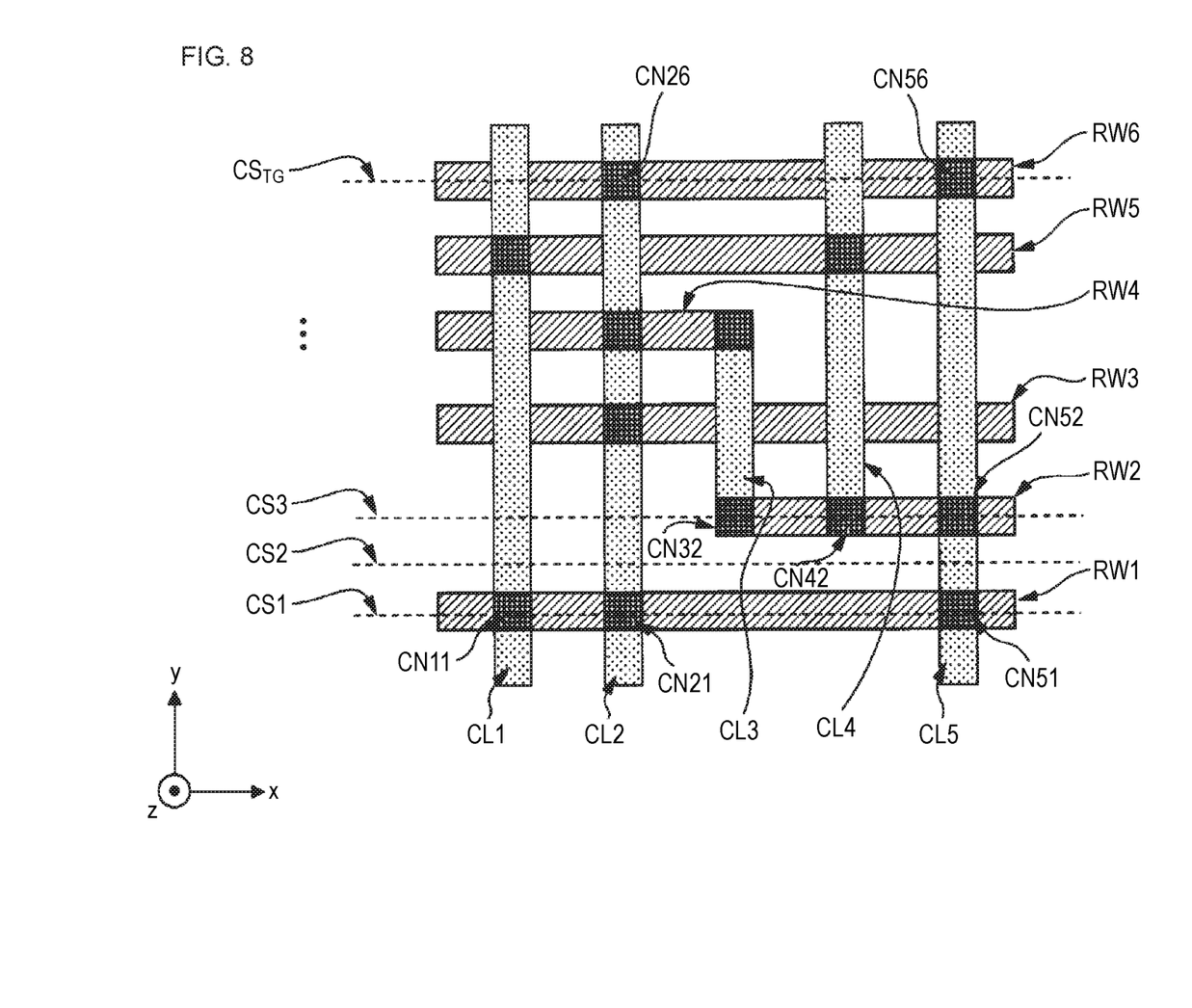
FIG. 8 shows an example of structure information used in the illustrative embodiment.

FIG. 8 shows an example of structure information ST used in the illustrative embodiment. In this example, the structure information ST is design information representing an internal structure of the sample 7. The structure information ST includes coordinate information of row-direction interconnections RW, coordinate information of column-direction interconnections CL, and coordinate information of connecting interconnections CN. In this example, the structure information ST represents a structure of [[5]]6-row/5-column matrix interconnections. These matrix interconnections have row-direction interconnections RW1 to RW6, column-direction interconnections CL1 to CL5, and connecting interconnections CN11, CN21, CN51, CN32, CN42, CN52, . . . , CN26, and CN56 that connect these row-direction interconnections RW and column-direction interconnections CL. In this example, these row-direction interconnections RW, column-direction interconnections CL, and connecting interconnections CN are repetitive structures RS as described above.

The automatic working apparatus 1 exposes the repetitive structures RS by performing slice working on the sample 7 with a working surface extending parallel with the xz plane. The automatic working apparatus 1 performs slice working in order of cross sections CS1, CS2, and CS3 while exposing structures of the sample 7. In the example shown in this figure, a cross section CSTG is located at a working end position PSTOP. FIGS. 9A-9D show examples of the cross sections CS1 to CS3 and CSTG.

Figure 9A:
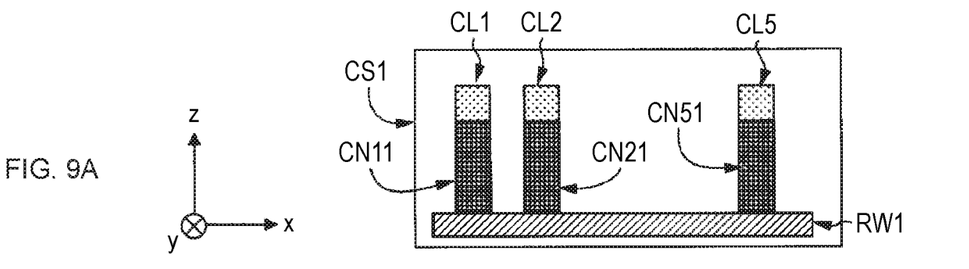
FIGS. 9A, 9B, 9C and 9D show an example of cross sections of slice working performed in the illustrative embodiment.
Figure 9B:
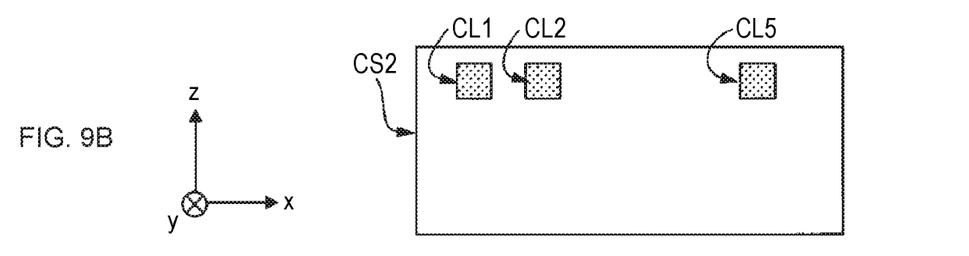
Figure 9C:
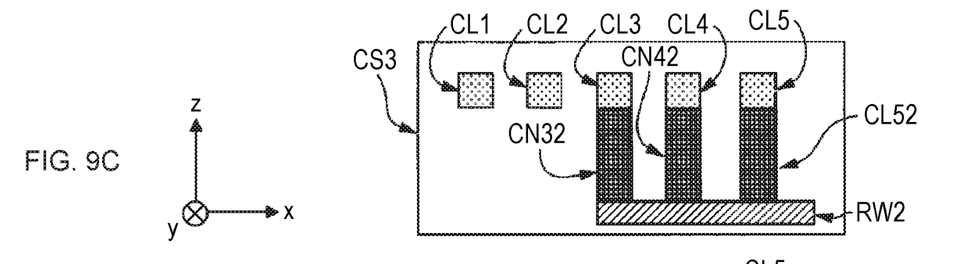
Figure 9D:
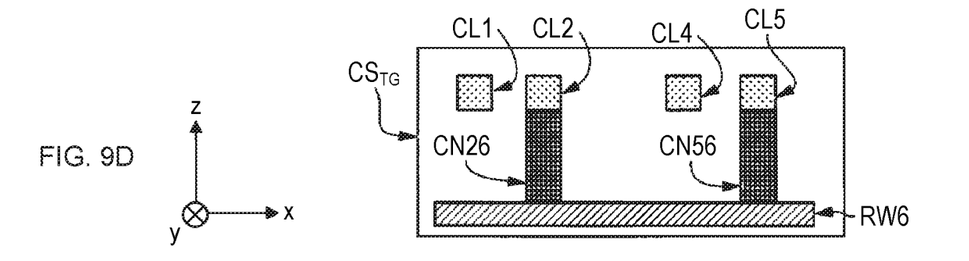

FIGS. 9A-9D show an example of cross sections CS of slice working performed in the illustrative embodiment. FIG. 9A shows the cross section CS1 of the sample 7. The row-direction interconnection RW1, the connecting interconnections CN11, CN21, and CN51, and the column-direction interconnections CL1, CL2, and CL5 are exposed in the cross section CS1. FIG. 9B shows the cross section CS2 of the sample 7. The column-direction interconnections CL1, CL2, and CL5 are exposed in the cross section CS2. FIG. 9C shows the cross section CS3 of the sample 7. The row-direction interconnection RW2, the connecting interconnections CN32, CN42, and CN52, and the column-direction interconnections CL1, CL2, CL3, CL4, and CL5 are exposed in the cross section CS3. FIG. 9D shows the cross section CSTG of the sample 7. The row-direction interconnection RW6, the connecting interconnections CL26 and CN56, and the column-direction interconnections CL1, CL2, CL4, and CL5 are exposed in the cross section CSTG.

The automatic working apparatus 1 estimates an arrangement of structures that are exposed in the cross section CSTG on the basis of the structure information ST. While performing slice working on the sample 7, the automatic working apparatus 1 compares an estimated arrangement of structures with structures appearing in each cross section CS (working surface). If the estimated structures appear in a working surface of the slice working, the automatic working apparatus 1 determines that the working end position PSTOP has been reached.

Although the illustrative embodiment and its modification have been described for the example case that the beam to be used for working the sample 7 is a focused ion beam (FIB), the invention is not limited to this case. The beam to be used for working the sample 7 may be a charged particle beam of charged particles other than ions or a neutral particle beam.

Furthermore, although the above description has been made for the example case that the detector for generating an image of a working surface of the sample 7 is the secondary electron detector 4 (charged particle detector), the invention is not limited to this case; any detector that makes it possible to recognize a structure of the sample 7 on the basis of its cross section can be employed.

The above-described illustrative embodiment is presented as an example and is not intended to restrict the scope of the invention. This novel illustrative embodiment can be practiced in other various forms and various omissions, replacements, and changes can be made without departing from the spirit and scope of the invention. Such illustrative embodiments and their modifications are included in the spirit and scope of the invention and also included in the invention as claimed and its equivalents.

The present application claims priority of Patent Application No. 2017-060902 filed with the Japanese Patent Office on Mar. 27, 2017, all the disclosure of which is invoked in this application.

The invention claimed is:
1. An automatic working apparatus comprising:
a charge particle beam column configured to irradiate a sample with a charged particle beam to produce a sample piece;
an input device configured to receive an operation of an operator; and
a controller connected to the input device and, based on the input device receiving a working start instruction, the controller is configured to:
obtain structure information indicating a structure of the sample before working;
obtain end position specifying information that specifies an end position of working corresponding to the structure of the sample;
control the charged particle beam column to irradiate the sample with the charged particle beam to perform working on the sample;

obtain a working surface image, the working surface image being obtained by imaging a working surface that appears at a position where the sample is irradiated with the charged particle beam;

determine whether a working position of the charged particle beam has reached the end position specified by the end position specifying information on the basis of a comparison between the obtained working surface image and the obtained structure information; and finish the working on the sample in response to it being determined in the determining that the working position of the charged particle beam has reached the end position.

2. The automatic working apparatus according to claim 1, wherein the structure information is an image obtained by imaging the sample before working, and wherein in determining, the controller is configured to determine whether the working position of the charged particle beam has reached the end position on the basis of a comparison between the working surface image and the image obtained by imaging the sample before working.

3. The automatic working apparatus according to claim 2, wherein the structure information is an image obtained by imaging repetitive structures of the sample before working;

wherein in obtaining the working end position, the controller is configured to obtain information indicating the repetition number of repetitive structures as the end position specifying information, and wherein in determining, the controller is configured to determine whether the working position of the charged particle beam has reached the end position on the basis of a result of comparison between the repetition number of repetitive structures found in working surface images and the repetition number of repetitive structures indicated by the image obtained by imaging the sample of the sample before working.

4. The automatic working apparatus according to claim 3, wherein in determining, the controller is configured to determine whether the working position of the charged particle beam has reached the end position on the basis of a comparison between the repetition number of repetitive structures remaining unworked that is indicated by working surface images and the repetition number of the repetitive structures indicated by the image obtained by imaging the repetitive structures of the sample before working.

5. The automatic working apparatus according to claim 3, wherein determining, the controller is configured to determine whether the working position of the charged particle beam has reached the end position on the basis of a comparison between the number of changes to a repetitive structure that occur sequentially in working surface images as the working proceeds and the repetition number of repetitive structures indicated by the image obtained by imaging the sample before working.

6. The automatic working apparatus according to claim 1, wherein the structure information is design information of the sample before working, and wherein in determining, the controller is configured to determine whether the working position of the charged particle beam has reached the end position on the basis of a comparison between the working surface image and the design information of the sample before working.

* * * * *